United States Patent [19]
El-Fishawy et al.

[11] Patent Number: 5,682,337
[45] Date of Patent: Oct. 28, 1997

[54] HIGH SPEED THREE-STATE SAMPLING

[75] Inventors: Sani El-Fishawy, Santa Clara; Andrew J. Read, Sunnyvale; L. Curtis Widdoes, Los Altos; Robert Mardjuki, Danville, all of Calif.

[73] Assignee: Synopsys, Inc., Mountain View, Calif.

[21] Appl. No.: 422,030

[22] Filed: Apr. 13, 1995

[51] Int. Cl.$^6$ .................................................. G06F 9/455
[52] U.S. Cl. ........................................ 364/578; 324/158.1
[58] Field of Search .......................... 340/310.05, 661; 324/73.1, 158 R, 158.1, 73 R, 761, 763; 364/578

[56] References Cited

U.S. PATENT DOCUMENTS

| | | | |
|---|---|---|---|
| 3,965,468 | 6/1976 | Bronson | 340/349 |
| 4,588,945 | 5/1986 | Groves et al. | 324/158 R |
| 4,637,020 | 1/1987 | Schinabeck | 371/20 |
| 4,744,084 | 5/1988 | Beck et al. | 364/578 |
| 4,947,113 | 8/1990 | Chism et al. | 324/158 R |
| 5,164,663 | 11/1992 | Alcorn | 324/158 R |
| 5,200,696 | 4/1993 | Menis et al. | 324/158 R |
| 5,218,293 | 6/1993 | Kan | 324/158 P |
| 5,266,894 | 11/1993 | Takagi et al. | 324/158 R |
| 5,521,493 | 5/1996 | Persons | 324/158.1 |

*Primary Examiner*—Kevin J. Teska
*Assistant Examiner*—Matthew Loppnow
*Attorney, Agent, or Firm*—Haverstock & Associates

[57] ABSTRACT

The present invention describes a novel method and apparatus for sampling an input/output pin of an electronic device at high speeds, comprising the steps of: driving the device input/output pin through a series resistor with a middle voltage between the high and low voltages of the device; sampling and latching the voltage at the input/output pin; comparing the latched voltage at the device input/output pin with a high threshold voltage which is between the high voltage of the device and the middle voltage; comparing the latched voltage at the device input/output pin with a low threshold voltage which is between the low voltage of the device and the middle voltage; and using the results of the two comparisons to determine whether the device input/output pin is driving high, driving low, or in an input mode.

18 Claims, 7 Drawing Sheets

HIGH SPEED THREE-STATE SAMPLING

BACKGROUND OF THE INVENTION

1. Field of the Invention

The present invention relates to the field of electronic circuit simulation, and more particularly to a method and apparatus for sampling a hardware device as part of an electronic circuit simulation.

2. Description of the Related Art

In today's highly competitive and fast moving electronics business, it is imperative that electronic circuit designers have the, ability to quickly and accurately test the design worthiness of an electronic circuit before it is made in production quantities. A traditional method of testing an electronic circuit design is to build a prototype of the circuit and subject it to instrumented laboratory testing. This technique is time consuming, expensive, and very labor-intensive, because it is very difficult to automate a prototype testing process. In addition, it is practically impossible to exhaustively test the responses of the circuit to a large number of possible combinations of inputs. Further, corrections or modifications to the circuit prototype are time consuming, expensive and prone to error. The fast moving pace of the electronics marketplace demands a more rapid and efficient way of designing electronic circuits.

Electronic circuit designers have long appreciated the value of using computers to simulate electronic circuit designs. Simulation provides a faster and less expensive process for designing electronic circuits, because design faults can be found and eliminated before an actual circuit is produced. In addition, it is possible to exhaustively test an electronic circuit design in an efficient manner, because the testing process can be partially automated. This means that a higher percentage of design faults are likely to be found before the design goes into production. For these reasons, circuit simulation has become an essential part of any modern electronic circuit design process.

However, as the devices used in modern electronic circuits have become increasingly complex, it has become more difficult, expensive and time consuming to create sufficiently accurate software models of each device. To design an accurate software model of a device, detailed specifications of the device must be obtained and understood. This is particularly problematic because device manufacturers are generally reluctant to disclose such detailed information about the internal operations of their devices.

In addition, because of the complexity of modern electronic devices, the software models of these devices have become correspondingly complex, causing the simulations of these devices to become unacceptably slow. For example, it is currently not feasible to use a software model of an Intel Pentium™ microprocessor to perform an accurate software simulation of a microcomputer motherboard circuit, because the complexity of the microprocessor would make an accurate software model of the microprocessor too cumbersome to be simulated at a reasonable level of performance. Further, as the complexity of the software models increases, the likelihood of inaccuracies in the models becomes increasingly likely.

For these reasons, electronic circuit designers began using circuit simulators which incorporated hardware modelers. U.S. Pat. No. 5,353,243, issued to Read et. al. describes such a system in detail. Such simulators use actual hardware devices instead of software models for the most complex electronic devices, and simulate the rest of the circuit in software. Thus, for example, an actual Pentium™ microprocessor might be installed in a hardware modeler which interfaced to a software circuit simulator, which used the hardware modeler along with software models of memory chips, BIOS chips, etc. to simulate the behavior of a microcomputer motherboard circuit. In such hardware modeling systems, the installed hardware device is referred to as the "hardware modeling element."

In hardware modeling systems, as well as in many other contexts, it is necessary to "sample", or determine the status of, any input/output pin of an electronic device at high speeds. Many modern electronic devices, such as microprocessors, employ phase-locked loops in their clocking circuitry. The use of phase-locked loops requires that such devices be operated at high clock rates, typically in the megahertz to gigahertz ranges. In addition, if the input clock to such a device is stopped, the device will typically continue to operate internally for some period of time, and therefore the outputs of the device will continue to change. Thus, for such devices to be used in hardware modeling systems, it is imperative that sampling be done at very high speeds.

A common method of sampling an output pin is to merely connect the pin to a standard flip-flop, and then clock the flip-flop to capture the output status of the pin (high or low) in the flip-flop. This method of sampling can provide very high performance sampling. However, this sampling technique can not correctly recognize if a pin is in an input state rather than an output state. If the pin being sampled is in an input mode, the pin would be in a high impedance state, causing an unpredictable result at the flip-flop.

Figure 1A:
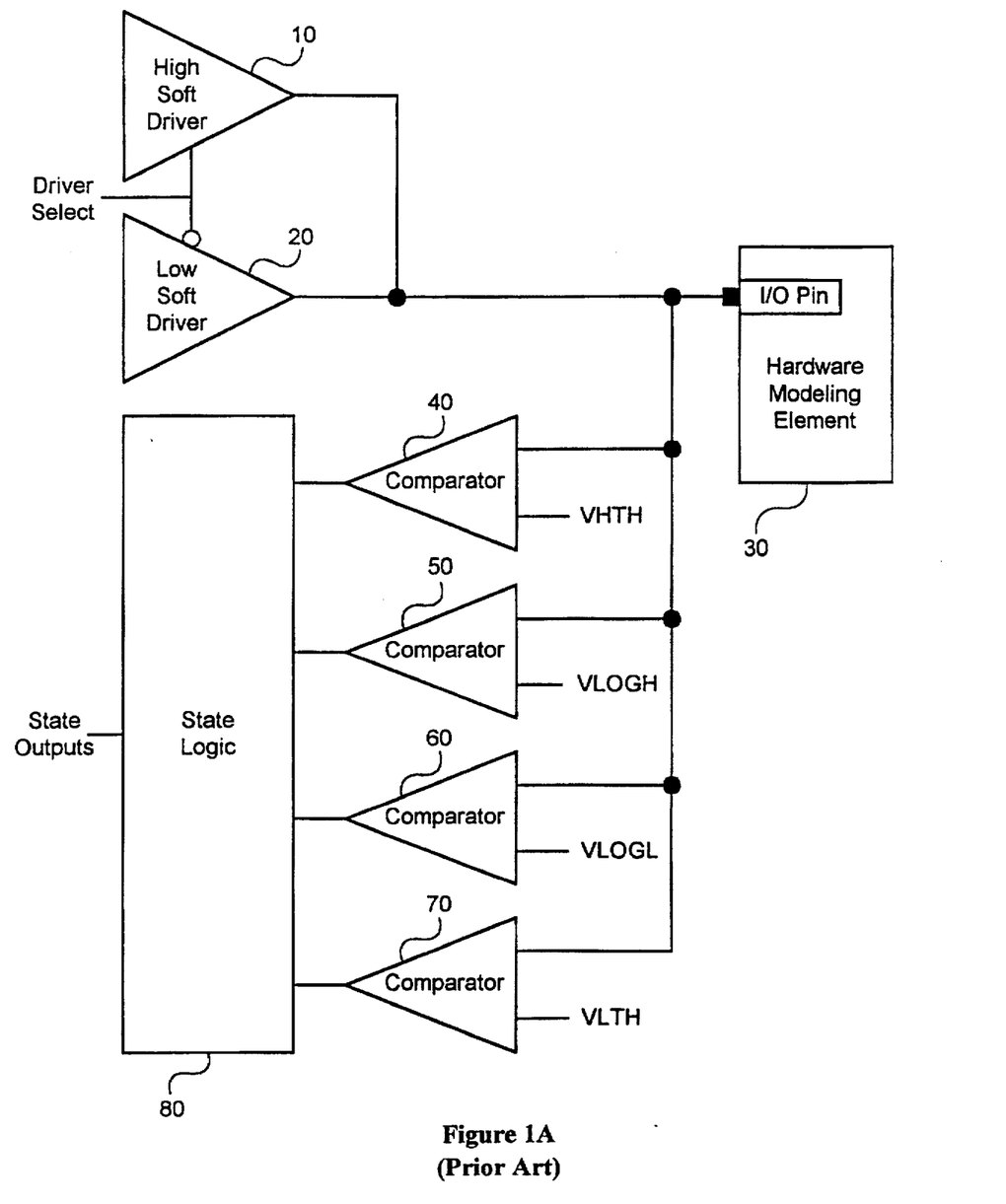
FIG. 1A is a block diagram of a traditional sampling circuit.

Another technique for sampling input/output pins is known as five-state sampling. U.S. Pat. No. 5,353,243, issued to Read et. al. describes such a technique. An example five-state sampling circuit is shown in FIG. 1A. As shown, a high soft driver 10 and a low soft driver 20 are connected to the input/output pin of the hardware modeling element 30. Each soft driver is a current limited source whose output current is less than the drive current of the device. This allows a soft driver to be "over-driven" by the device if both a soft driver and the device are driven simultaneously. In addition, the input/output pin is connected to an input of each of four comparators 40, 50, 60 and 70. Each comparator has a different DC voltage applied to its other input, so that the voltage at the input/output pin can be compared to four different reference voltages, denoted as VHTH, VLOGH, VLOGL and VLTH. The outputs of the comparators are connected to state logic 80, which generates state output signals based upon the outputs of the comparators.

Figure 1B:
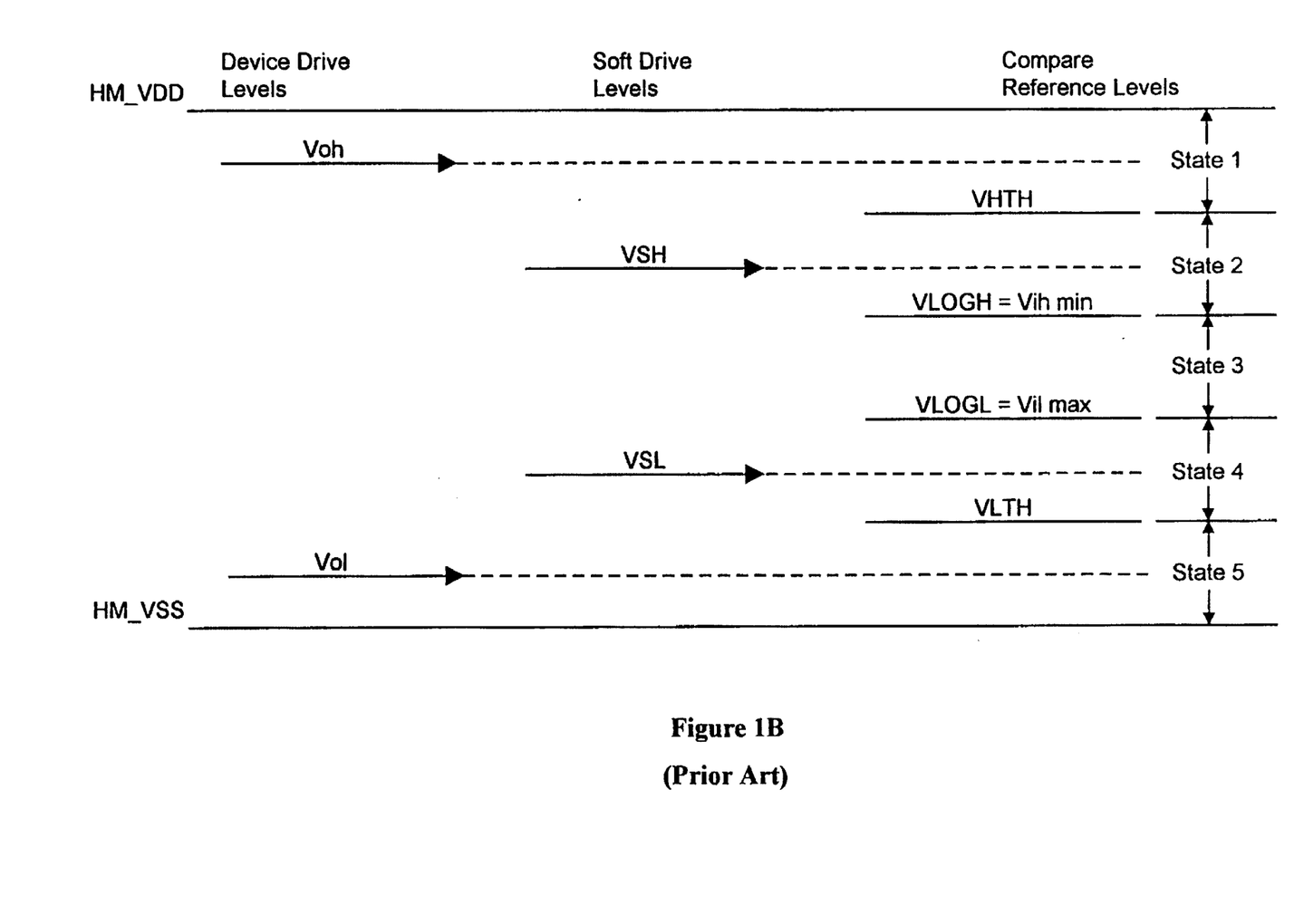
FIG. 1B is a diagram of the voltage levels and ranges used in the operation of the traditional sampling circuit depicted in FIG. 1A.

FIG. 1B is a diagram indicating the various voltage levels and ranges used in the five-state sampling circuit of FIG. 1A. In operation, the high soft driver 10 is enabled by a DRIVER SELECT signal, and the high soft driver applies a soft high voltage VSH to the input/output pin, where VSH is less than the standard high output voltage (Voh) of the device. The voltage at the input/output pin is then compared to the reference voltages by the comparators 40, 50, 60 and 70 to determine which of the 5 states shown in FIG. 1B the voltage corresponds to.

If the device is driving a high, or "one" state, the soft driver will be over-driven high to a voltage above the reference voltage VHTH, which is depicted as State 1. If the device is driving a low, or "zero" state, the soft driver will be over-driven low to a voltage below the reference voltage VLOGL, and thus to either State 4 or State 5. If the device input/output pin is in an input, or high impedance mode, the voltage at the pin will stay at approximately the soft high voltage VSH, and thus will be in State 2. State 3 is an error condition state which should not occur in normal operation. The state logic 80 receives the outputs of the comparators 40, 50, 60 and 70 and uses the comparator outputs to determine which state the voltage corresponds to, and thus determines the condition (output high, output low or high impedance) of the input/output pin. It should be clear that a similar, complementary process can be used by enabling the low soft driver 20, applying a soft low voltage VSL to the input/output pin, and using the comparator outputs to determine the condition of the input/output pin.

Thus, the five-state sampling process distinguishes between output high, output low and input (high impedance) conditions at an input/output pin. However, because of the low currents supplied by the soft drivers, there is significant delay before the pin voltage stabilizes. Thus, five-state sampling cannot be used to sample at high speeds, and is inappropriate for sampling modern devices which use phase-locked loops in their clocking circuitry.

Figure 1C:
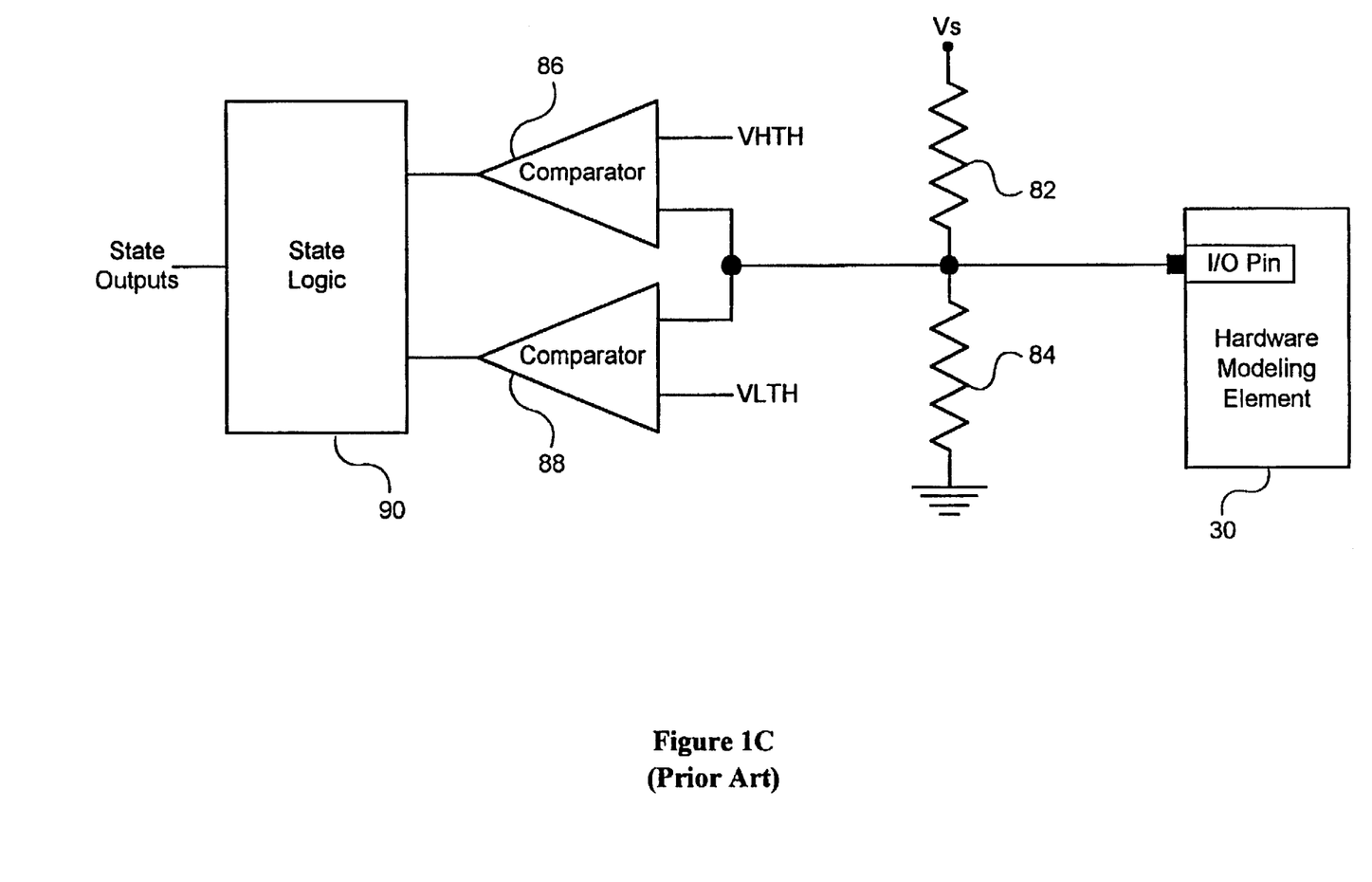
FIG. 1C is a block diagram of another traditional sampling circuit.

The Daisy Physical Modeling Extension (PMX) system is a hardware modeling system which employs a different technique for sampling. A circuit using this technique is shown in FIG. 1C. A pull-up resistor 82 is connected between a voltage source and an input/output pin of the hardware modeling element 30. A pull-down resistor 84 is connected between the input/output pin and ground. The resistors are chosen so that the input/output pin is biased to a middle voltage which is between the standard high voltage and the standard low voltage of the hardware modeling element 30; for example, for a typical device, the pin might be biased to 1.4 volts. The resistor values are chosen to be large (for example, 10K ohms) so that when the input/output pin drives an output voltage it is able to over-drive the resistors' bias voltage. One input of each of two comparators 86 and 88 is connected to the input/output pin. The other input of comparator 86 is connected to a reference high threshold voltage VHTH which is between the middle voltage and the standard high voltage of the hardware modeling element 30; for example, VHTH might be 2.0 volts for a typical device. The other input of comparator 88 is connected to a reference low threshold voltage VLTH which is between the middle voltage and the standard low voltage of the hardware modeling element 30; for example, VLTH might be 0.8 volts for a typical device. The outputs of the comparators are connected to state logic 90, which generates state outputs.

In operation, if the input/output pin is driving a "one", the input/output pin will over-drive the resistors' bias voltage high to a voltage above VHTH, which will be recognized by comparator 86. If the input/output pin is driving a "zero", the input/output pin will over-drive the resistors' bias voltage low to a voltage below VLTH, which will be recognized by comparator 88. If the input/output pin is in an input, or high impedance state, the comparators will both receive the middle voltage of the biased resistor pair, which is neither above VHTH nor below VLTH. The outputs of the comparators are received by state logic 90, which decodes the comparator outputs to determine the state of the input/output pin, and generates state output signals based upon the state of the input/output pin.

In this way, this circuit can recognize and distinguish between output high, output low and input (high impedance) conditions at an input/output pin. However, the use of large pull-up and pull-down resistors, which are necessary so that the pin can overdrive the bias voltage, gives this circuit a very large time constant, and therefore significant delay is required before the pin voltage stabilizes and can be sampled. Thus, like the five-state sampling technique described above, this technique cannot be used for high speed sampling, and is inappropriate for sampling modern devices which use phase-locked loops in their clocking circuitry.

What is therefore needed is a method of sampling an input/output pin of a device at high speeds which accurately distinguishes between output high, output low, and input (high impedance) conditions.

SUMMARY OF THE INVENTION

Briefly, the present invention describes a novel method and apparatus for sampling an input/output pin of an electronic device at high speeds, comprising the steps of: driving the device input/output pin through a series resistor with a middle voltage between the high and low voltages of the device; sampling and latching the voltage at the input/output pin; comparing the latched voltage at the device input/output pin with a high threshold voltage which is between the high voltage of the device and the middle voltage; comparing the latched voltage at the device input/output pin with a low threshold voltage which is between the low voltage of the device and the middle voltage; and using the results of the two comparisons to determine whether the device input/output pin is driving high, driving low, or in an input mode.

BRIEF DESCRIPTION OF THE DRAWINGS

The accompanying drawings, which are incorporated and constitute a part of this specification, illustrate particular embodiments of the invention, and together with the description, serve to explain the principles of the invention.

DETAILED DESCRIPTION OF THE PREFERRED EMBODIMENT

The present invention comprises a novel method and apparatus for sampling an input/output pin of an electronic device at high speeds. The following description is presented to enable any person skilled in the art to make and use the invention. Descriptions of specific applications are provided only as examples. Various modifications to the preferred embodiment will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Reference will now be made in detail to the presently preferred embodiments of the invention, examples of which are illustrated in the accompanying drawings.

Figure 2:
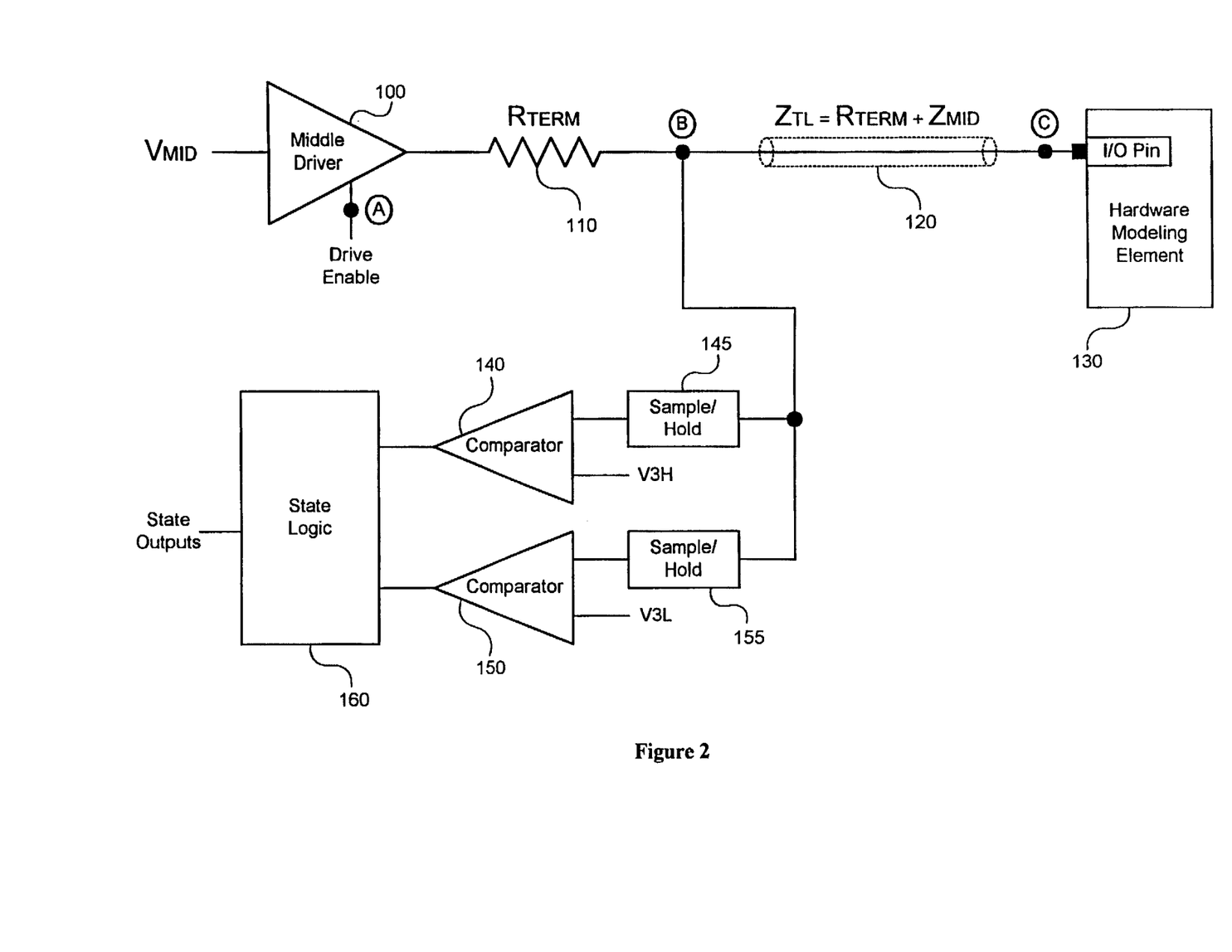
FIG. 2 is a block diagram of a sampling circuit in accordance with an embodiment of the present invention.

FIG. 2 is a block diagram of a sampling circuit in accordance with an embodiment of the present invention.

As shown, a middle driver 100 is connected to a terminating resistor (Rterm) 110 which is connected to the input/output pin of the hardware modeling element 130 through a wire 120. The middle driver 100 is a low impedance driver which receives an input voltage Vmid and drives that voltage to the terminating resistor (Rterm) 110 to pull the driver side of the terminating resistor to Vmid. In addition, the input/output pin is connected to the inputs of sample/hold elements 145 and 155. The output of the sample/hold element 145 is connected to an input of comparator 140, and the output of sample/hold element 155 is connected to an input of comparator 150. Each of the two comparators has a different DC voltage applied to its other input, so that the voltage sampled from the input/output pin can be compared to two different reference voltages, denoted as V3H and V3L. The outputs of comparators 140 and 150 are connected to state logic 160, which uses the comparator outputs to generate state output signals.

Figure 3:
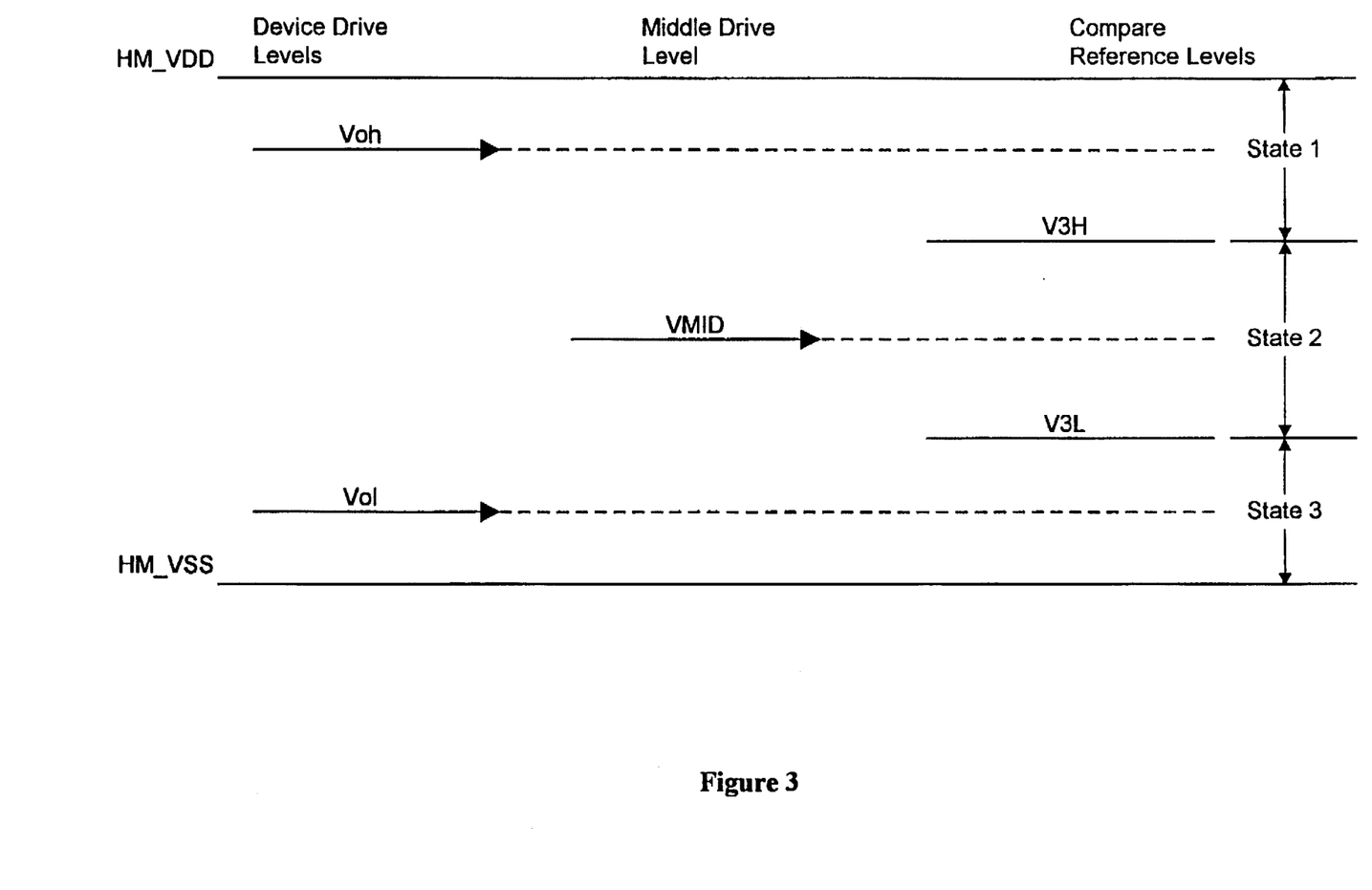
FIG. 3 is a diagram of the voltage levels and ranges used in the operation of the sampling circuit depicted in FIG. 2.

FIG. 3 is a diagram of the voltage levels and ranges used in the operation of the sampling circuit depicted in FIG. 2. In operation, the middle driver 100 pulls the driver side of the termination resistor 110 to Vmid. Sample/hold elements 145 and 155 then latch the voltage at the device side of the termination resistor and provide the latched voltage to comparators 140 and 150. Comparators 140 and 150 compare the latched voltage to reference voltages V3L and V3H to produce comparator outputs. The state logic 160 uses the comparator outputs to determine which of three voltage ranges (State 1, State 2 or State 3) the voltage corresponds to, and generates corresponding state output signals.

If the device is driving a high, or "one" voltage, the device side of the termination resistor 110 will be pulled up to a voltage above V3H, denoted as State 1, which will cause a corresponding output from comparator 140. If the device is driving a low, or "zero" state, the device side of the termination resistor 110 will be pulled down to a voltage below V3L, denoted as State 3, which will cause a corresponding output from comparator 150. If the device input/output pin is in an input, or high impedance mode, the device side of the termination resistor will remain at about Vmid, which is above V3L and below V3H, and is denoted as State 2, which will cause corresponding outputs from comparators 140 and 150. Thus, the state logic 160 uses the outputs of comparators 140 and 150 to determine which state the pin voltage corresponds to, and maps the state information to determine whether the input/output pin is driving high, driving low, or in an input mode. The state logic then generates state output signals corresponding to the condition of the input/output pin.

Thus, the three state sampling circuit of the present invention provides the ability to sample an input/output pin of a device and accurately distinguish between output high, output low, and input (high impedance) states.

As shown in FIG. 2, the terminating resistor (Rterm) 110 is connected to the input/output pin of the hardware modeling element 130 by the wire 120. The wire 120 acts as a transmission line for purposes of timing analysis. The terminating resistor (Rterm) 110 is chosen so that the impedance of the transmission line 120 is approximately the same as the impedance of the series combination of the termination resistor 110 and the middle driver 100. The use of series termination for impedance matching is a well known technique for minimizing transitional reflections of signals. By matching the impedances on both sides of the resistor/transmission line interface, there is no reflection at that interface, and the voltage on the device side of the resistor 110 reaches a steady-state condition very quickly (after one round trip to the device and back), thus allowing the voltage to be sampled quickly. Sample/hold elements are used to latch the analog voltage, because the input/output pin state may change very quickly, and may violate the timing requirements of the comparators. It should be clear that sampling comparators, which latch the voltage at the comparator, may be used instead of the separate sample/hold elements. In addition, it should be clear that the use of high speed comparators may obviate the need to use sample/hold elements in certain situations.

Figure 4:
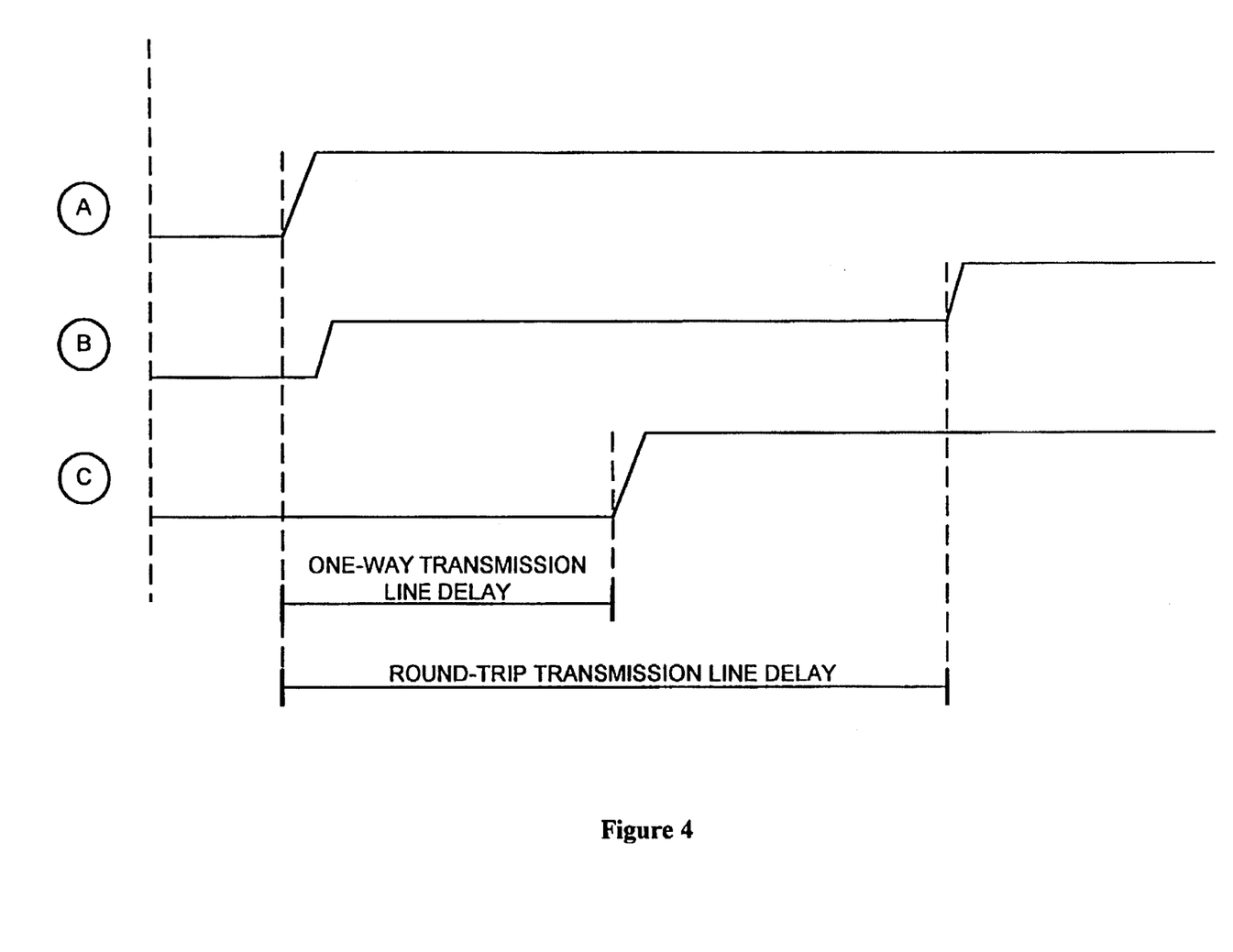
FIG. 4 is a timing diagram indicating the timing relationships between the driving and sampling functions of the sampling circuit of the present invention.

FIG. 4 is a timing diagram indicating the timing relationships between the driving and sampling functions of the sampling circuit of the present invention.

The timing diagrams shown in FIG. 4 show the progression of signals through the circuit. As shown, signals are shown at three points in the circuit of FIG. 2: point A, the ENABLE input to the middle driver; point B, the device side of the terminating resistor; and point C, the device input/output pin.

The signals shown in FIG. 4 are for the example case in which the input/output pin is in an input (high impedance) state. The timing relationships for other states are very similar. In FIG. 4, point A is shown as receiving a step function at the ENABLE input to the middle driver. This ENABLE input causes the middle driver to apply a voltage to the terminating resistor. As shown, this causes a step at point B, which is the other side of the same resistor. Since point B is between two approximately equal impedances, the circuit acts as a voltage divider, and the voltage at point B goes to one-half of Vmid. The signal then propagates through the transmission line 120 to point C, the input/output pin. At this point, the signal is reflected back, and the reflected signal is added to the incoming signal. Thus, the addition of the two signals causes the voltage at point C step to Vmid. The reflected signal then propagates back across the transmission line 120 to point B, which reaches Vmid after one round trip delay of the transmission line. Because of the series termination impedance matching, no further reflections occur. Thus, the voltage at point B reaches a steady-state equilibrium very quickly (after twice the delay of the transmission line, which is typically a few nanoseconds), and can then be sampled and compared to the reference voltages.

While these timing relationships have been described assuming the input/output pin is in a high impedance state, the timing relationships are very similar when the input/output pin is driving a voltage. As described above, point B initially acts like a voltage divider between Vmid and the pin's driven voltage, but reaches its final value and stabilizes at that value after one round-trip delay of the transmission line, and can quickly be sampled and compared to the reference voltages.

Thus, the sampling circuit of the present invention provides the ability to sample an input/output pin of a device at much higher speeds than prior techniques, which makes it ideal for sampling modern high speed electronic devices, especially those that use phase-locked loops in their clocking circuitry.

Figure 5:
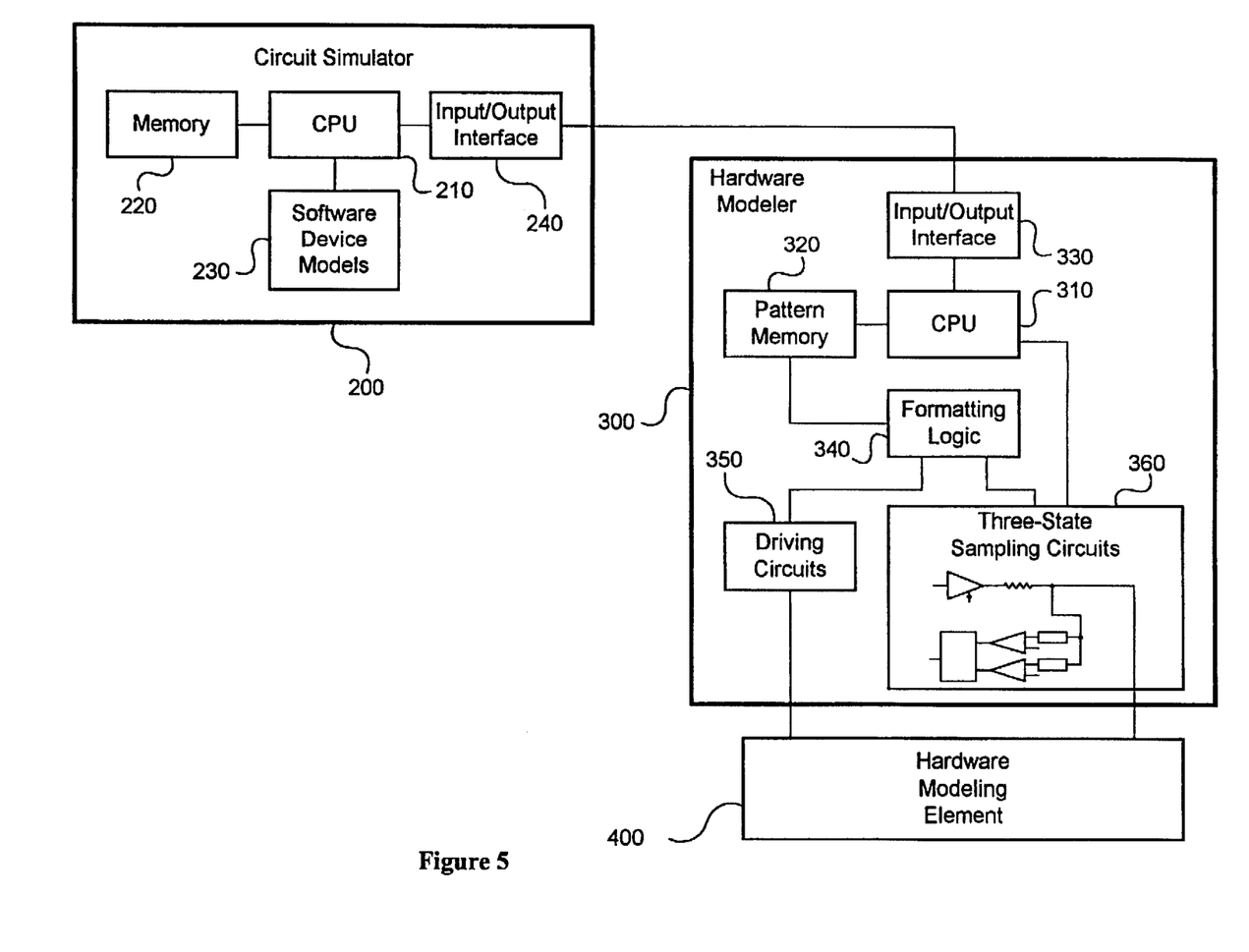
FIG. 5 is a block diagram of a circuit simulation system incorporating the sampling circuit of the present invention.

FIG. 5 is a block diagram of a circuit simulation system incorporating the high speed three-state sampling circuit of the present invention. As described in the Background section, hardware modeling systems used for circuit simulation typically require high speed sampling, especially for devices using phase-locked loops in their clocking circuitry.

As shown, the system includes a circuit simulator 200, which includes a central processing unit 210, a memory 220, software device models 230, and an input/output interface 240. In addition, the system includes a hardware modeler 300, which includes a central processing unit 310, a pattern memory 320, an input/output interface 330, formatting logic 340, driving circuits 350, and three-state sampling circuits 360. Finally, the system includes a hardware modeling element 400.

In operation, the circuit simulator 200 runs simulation software in the CPU 210 and memory 220, which simulates a circuit by using a software description of the circuit elements and their interconnections, and uses software device models to model most of the circuit elements. In addition, the circuit simulator 200 communicates with a hardware modeler 300 to model the hardware modeling element 400. The communication between the circuit simulator 200 and the hardware modeler 300 is handled by the input/output interfaces 240 and 330, which preferably communicate over a high speed network such as an Ethernet network.

As part of the circuit simulation, the circuit simulator 200 generates a "stimulus pattern" representing the values of input signals to be sent to the hardware modeling element. This stimulus pattern is encoded and delivered to the hardware modeler 300 over the network. The CPU 310 receives the stimulus pattern through the input/output interface 330, decodes the stimulus pattern and stores it in the pattern memory 320 as part of a history sequence of stimulus patterns. The history sequence mimics the electrical behavior of the circuitry connected to the corresponding component of the circuit being simulated.

The pattern memory 320, which may include a dedicated memory controller, sends the history sequence of stimulus patterns to the formatting logic 340, which decodes the stimulus patterns to generate the necessary control and data signals for the driving circuits 350 and the sampling circuits 360. The formatting logic then sends the control and data signals corresponding to the stimulus pattern to the driving circuits 350, which applies the stimulus pattern data, with the correct timing, to the the pins of the hardware modeling element 400. The three-state sampling circuits 360 of the present invention are then used to sample, at high speeds, the input/output pins of the hardware modeling element 400, and the samples are delivered to the CPU 310. The CPU 310 collects the samples and formats them as an "output pattern", which is then encoded and sent over the network to the circuit simulator 200 for further simulation.

The preceding description of circuit simulation and hardware modeling systems is intended to merely describe an application of the high-speed three-state sampling circuit of the present invention. U.S. Pat. No. 5,353,243, issued to Read et. al., provides a more complete description of the structure and operation of such systems, and is hereby incorporated by reference in its entirety.

As explained in the Background, such hardware modeling systems require high speed sampling, because the hardware modeling element must be operated at high speeds, especially if it includes internal phase-locked loops in its clocking circuitry. Thus, the sampling circuit of the present invention provides a significant advantage in the design of hardware modeling systems.

Various additional modifications of the invention will be apparent to those skilled in the art from the foregoing description and accompanying drawings. Such modifications are intended to fall within the scope the following claims.

What is claimed is:

1. A method of sampling an input/output pin of a hardware modelling element having a standard high voltage output state, and a standard low voltage output state, and a high impedance input state, comprising the steps of:

providing a series connection of a voltage driver, a single resistor and a conductor which is connected to the input/output pin, the conductor having an impedance equal to the impedance of the series combination of the voltage driver and the resistor, such that the input/output pin is not impedance isolated from the conductor;

driving the input/output pin with the voltage driver through the resistor and the conductor with a fixed voltage which is between a standard high voltage and a standard low voltage;

comparing the voltage at the input/output pin with a high threshold voltage which is between the standard high voltage and the fixed voltage;

comparing the voltage at the input/output pin with a low threshold voltage which is between the standard high voltage and the fixed voltage; and automatically determining from the results of the two comparisons whether the input/output pin is outputting a standard high voltage, is outputting a standard low voltage, or is in a high impedance input mode.

2. A sampling circuit for determining a state of an input/output pin of a hardware modelling element, comprising:

a single resistor having a first connection and a second connection;

a low impedance voltage driver coupled to deliver a fixed voltage to the first connection of the resistor;

a conductor connected to the second connection of the resistor, and connected to the input/output pin, the conductor having an impedance equal to the sum of the impedance of the resistor and an output impedance of the middle driver, wherein no isolation impedance is coupled between the input/output pin and the conductor, and further wherein the device will overdrive the middle driver when the input/output pin is configured in an output mode;

a first comparator having a first input and a second input, the first input of the first comparator connected to the second connection of the resistor, and the second input of the first comparator receiving a high threshold voltage, the first comparator operative to compare the first input of the first comparator and the second input of the first comparator to determine which is larger, and output a first comparison signal;

a second comparator having a first input and a second input, the first input of the second comparator connected to the second connection of the resistor, and the second input of the second comparator receiving a low threshold voltage, the second comparator operative to compare the first input of the second comparator and the second input of the second comparator to determine which is larger, and output a second comparison signal;

whereby the first comparison signal and the second comparison signal are used to determine whether the input/ output pin is outputting a standard high voltage, is outputting a standard low voltage, or is in a high impedance input mode.

3. The method as claimed in claim 1 further comprising the step of sampling the voltage at the input/output pin.

4. A method of sampling a voltage at an input/output pin of a hardware modelling element having a standard high voltage level and a standard low voltage level, comprising the steps of:

a. driving a node to a predetermined voltage level through a series impedance, the node coupled to the pin through a conductor having no isolation impedance connected to the pin, wherein depending on a state of the pin, the node is pulled to an appropriate one of the standard high voltage level, the standard low voltage level and the predetermined voltage level such that the pin overdrives the node in an output mode;

b. comparing a node voltage at the node to a high threshold voltage;

c. comparing the node voltage to a low threshold voltage; and d. determining whether the state of the pin is at the standard high voltage level, the standard low voltage level or is in an input mode.

5. The method as claimed in claim 4 wherein the standard high voltage level represents a logical high voltage level, the standard low voltage level represents a logical low voltage level and the predetermined voltage level represents the input mode.

6. The method as claimed in claim 5 wherein the high threshold voltage is between the standard high voltage level and the middle voltage level and the low threshold voltage is between the standard low voltage level and the predetermined voltage level.

7. The method as claimed in claim 4 wherein the node is coupled to the pin through a transmission line having an impedance equal to the series impedance.

8. The method as claimed in claim 4 further comprising the step of generating a first comparison output signal, wherein the first comparison output signal is at a logical low voltage level if the node voltage is less than the high threshold voltage and is at a logical high voltage level if the node voltage is greater than the high threshold voltage.

9. The method as claimed in claim 8 further comprising the step of generating a second comparison output signal, wherein the second comparison output signal is at a logical low voltage if the node voltage is less than the low threshold voltage and is at a logical high voltage level if the node voltage is greater than the low threshold voltage.

10. A sampling circuit for determining a state of an input/output pin of a hardware modelling element, comprising:

a. a voltage driver having a driver input and a driver output, wherein the driver input is coupled to receive a driving voltage level;

b. an impedance element having a first terminal and a second terminal, wherein the impedance element is serially coupled between the voltage driver and the input/output pin with the first terminal coupled to the driver output and the second terminal coupled to the input/output pin for driving the second terminal to the driving voltage level, and further wherein depending on the state of the input/output pin, the second terminal is pulled to an appropriate one of the standard high voltage level, the standard low voltage level and the driving voltage level; and c. a determining circuit coupled to the second terminal for determining the state of the input/output pin.

11. The sampling circuit as claimed in claim 10 wherein the impedance element is a resistor.

12. The sampling circuit as claimed in claim 11 wherein the second terminal is coupled to the input/output pin by a transmission line having an impedance value equal to a series impedance value of the resistor and the voltage driver.

13. The sampling circuit as claimed in claim 12 wherein the determining circuit comprises:

a. a first comparator coupled to receive a voltage level from the second terminal for comparing the voltage level to a high threshold level; and a second comparator coupled to receive a voltage level from the second terminal for comparing the voltage level to a low threshold level.

14. The sampling circuit as claimed in claim 13 wherein the standard high voltage level represents a logical high voltage level, the standard low voltage level represents a logical low voltage level and the driving voltage level represents an input mode.

15. The sampling circuit as claimed in claim 14 wherein the high threshold voltage is between the standard high voltage level and the driving voltage level and the low threshold voltage is between the standard low voltage level and the driving voltage level.

16. A circuit testing apparatus for simulating and testing a circuit comprising:

a. a circuit simulator for simulating components of the circuit;

b. a hardware modeling element representing an actual component within the circuit, the hardware modeling element having one or more pins; and c. a hardware modeler coupled between the circuit simulator and the hardware modeling element for driving and sampling the one or more pins in response to signals from the circuit simulator, wherein the hardware modeler includes a sampling circuit for sampling the one or more pins, the sampling circuit comprising:

i. one or more voltage drivers, each having a driver input and a driver output, wherein each of the driver inputs is coupled to receive a fixed driving voltage level;

ii. a single impedance element for each of the voltage drivers, each having a first terminal and a second terminal, wherein each impedance element is serially coupled between one of the voltage drivers and one of the one or more pins, with the first terminal coupled to the driver output and the second terminal coupled to the pin for driving the second terminal to the driving voltage level, and further wherein the second terminals are pulled to an appropriate one of a standard high voltage level, a standard low voltage level and the driving voltage level depending on a state of a corresponding one of the one or more pins; and iii. one or more determining circuit coupled to each of the second terminals for determining the state of the one or more pins.

17. The circuit testing apparatus as claimed in claim 16 wherein the impedance elements are resistors.

18. The circuit testing apparatus as claimed in claim 17 wherein each of the second terminals are coupled to the corresponding pin by a transmission line having an impedance value equal to a series impedance value of the resistor and the voltage driver.

* * * * *